United States Patent
Hsu et al.

(10) Patent No.: US 9,287,285 B2
(45) Date of Patent: Mar. 15, 2016

(54) SELF-ALIGNED LINER METHOD OF AVOIDING PL GATE DAMAGE

(71) Applicant: Macronix International Co., Ltd., Hsinchu (TW)

(72) Inventors: Fang-Hao Hsu, Hsinchu (TW); Zusing Yang, Hsinchu (TW); Hong-Ji Lee, Taoyuan County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/672,777

(22) Filed: Mar. 30, 2015

(65) Prior Publication Data
US 2015/0228661 A1   Aug. 13, 2015

Related U.S. Application Data

(62) Division of application No. 13/942,490, filed on Jul. 15, 2013, now Pat. No. 9,012,282.

(60) Provisional application No. 61/778,491, filed on Mar. 13, 2013.

(51) Int. Cl.
| | | |
|---|---|---|
| *H01L 29/78* | (2006.01) |
| *H01L 27/115* | (2006.01) |
| *H01L 29/40* | (2006.01) |
| *H01L 21/8238* | (2006.01) |
| *H01L 21/28* | (2006.01) |
| *H01L 29/423* | (2006.01) |
| *H01L 29/06* | (2006.01) |
| *H01L 29/49* | (2006.01) |
| *H01L 29/51* | (2006.01) |

(52) U.S. Cl.
CPC .... *H01L 27/11568* (2013.01); *H01L 21/28273* (2013.01); *H01L 21/823835* (2013.01); *H01L 27/11521* (2013.01); *H01L 29/0684* (2013.01); *H01L 29/401* (2013.01); *H01L 29/42324* (2013.01); *H01L 29/4916* (2013.01); *H01L 29/513* (2013.01); *H01L 29/518* (2013.01); *H01L 29/78* (2013.01)

(58) Field of Classification Search
CPC ............... H01L 21/82385; H01L 27/11568; H01L 27/11521; H01L 29/78; H01L 29/0684; H01L 29/513; H01L 29/514; H01L 29/42324; H01L 29/4916
USPC .................................................. 257/396, 397
See application file for complete search history.

(56) References Cited

U.S. PATENT DOCUMENTS 9,012,282 B2 * 4/2015 Hsu ........................ H01L 29/401
257/E45.002

\* cited by examiner

*Primary Examiner* — Michael Lebentritt
(74) *Attorney, Agent, or Firm* — Stout, Uxa & Buyan, LLP; Frank J. Uxa (57) ABSTRACT

A self-align method of preparing semiconductor gates for formation of a silicide, such as a cobalt silicide (CoSi) layer, is disclosed. Deposition of silicon nitride (SiN) and low-temperature oxide (LTO) liner types, the SiN liner having an overhang structure, prevent damage to the gates while forming a self-aligned source. The undamaged gates are suitable for CoSi deposition.

18 Claims, 10 Drawing Sheets

FIG. 4Da Y-dir

FIG. 4Db X-dir

SELF-ALIGNED LINER METHOD OF AVOIDING PL GATE DAMAGE

CROSS-REFERENCE TO RELATED APPLICATIONS

This application is a divisional application of Ser. No. 13/942,490, filed Jul. 15, 2013, and claims the benefit of U.S. Provisional Application No. 61/778,491 filed on Mar. 13, 2013, the entire contents of which are hereby incorporated by reference.

BACKGROUND OF THE INVENTION

1. Field of the Invention

The present invention relates generally to semiconductor fabrication methods and, more particularly, to a method of improving reliability of scaled-down memory cells.

2. Description of Related Art

Increased miniaturization of components, high performance, and low cost of integrated circuits have long been goals of the computer industry. One technique in the continuing scaling-down of semiconductor memory cells involves fabrication of a semiconductor gate, such as a control gate of a flash memory cell, including depositing a metal-containing material onto a semiconducting layer as a semiconductor gate to form silicide. However, if and to the extent the gate is damaged during fabrication, an associated deformed or non-uniform profile of the gate can adversely affect the silicide formation and, hence, chip quality.

A situation may arise, for example, where damage to a gate, such as a polysilicon (PL) gate, may cause, or contribute to, or occur in connection with, a following silicide formation being too closely disposed to an insulating layer. When the insulation layer is a charge trapping dielectric of the gate, such as an oxide-nitride-oxide (ONO) layer of a memory device, electrical problems may occur as a consequence of the silicide being formed too closely to the insulation layer. Such occurrence may undesirably manifest, for instance, resistance, reliability, retention and disturb issues.

A need thus exists in the prior art for a method of forming undamaged or optimized semiconductor gates suitable for silicide formation thereon, or the like, or improved operation therewith.

SUMMARY OF THE INVENTION

The present invention is directed to addressing these needs by providing a method of preparing semiconductor gates, such as polysilicon (PL) gates, for silicide formation or the like. An implementation of the method may comprise providing a semiconductor structure that includes a substrate with a plurality of first PL features disposed above the substrate and insulated therefrom by an insulator/dielectric layer. For a memory cell, with the semiconductor gates, e.g., PL gates, normally spaced apart, a plurality of second semiconductor features, e.g., PL features, may be disposed above the first PL features with the first and second PL features being insulated from one another. The implementation, further, may comprise disposing a first liner layer over the semiconductor structure and disposing a second liner layer over the first liner layer. The second liner layer can be constructed with a first width at an upper portion of the semiconductor structure and with a second width at a lower portion of the semiconductor structure, the second width being less than the first width.

According to a particular implementation, the disposing of the first and second liner layers may comprise disposing the second liner layer with a first thickness at an upper portion of the second PL gates and with a second thickness at a lower portion between spaced-apart first PL gates, the second thickness being less than the first thickness. The disposing of the second liner layer, according to another implementation, may comprise creating an overhang near an upper portion of the second PL gates, thereby facilitating formation of a self-aligned source in the substrate.

While the apparatus and method has or will be described for the sake of grammatical fluidity with functional explanations, it is to be expressly understood that the claims, unless indicated otherwise, are not to be construed as limited in any way by the construction of "means" or "steps" limitations, but are to be accorded the full scope of the meaning and equivalents of the definition provided by the claims under the judicial doctrine of equivalents.

Any feature or combination of features described or referenced herein are included within the scope of the present invention provided that the features included in any such combination are not mutually inconsistent as will be apparent from the context, this specification, and the knowledge of one skilled in the art. In addition, any feature or combination of features described or referenced may be specifically excluded from any embodiment of the present invention. For purposes of summarizing the present invention, certain aspects, advantages and novel features of the present invention are described or referenced. Of course, it is to be understood that not necessarily all such aspects, advantages or features will be embodied in any particular implementation of the present invention. Additional advantages and aspects of the present invention are apparent in the following detailed description and claims that follow.

BRIEF DESCRIPTION OF THE FIGURES

FIG. 4Da illustrates an effect of removing the LTO layer from the structure of FIG. 4C to expose PL gates as viewed along a Y-axis;

FIG. 4Db is an X-axis view of the structure of FIG. 4Da;

FIG. 4Ea describes a result of forming a silicide on the PL gates in the formation of FIG. 4Da;

FIG. 4Eb shows detail of a SAS region of the structure of FIG. 4Ea;

DETAILED DESCRIPTION OF THE PRESENTLY PREFERRED EMBODIMENTS

Embodiments of the invention are now described and illustrated in the accompanying drawings, instances of which are to be interpreted to be to scale in some implementations while in other implementations, for each instance, not. In certain aspects, use of like or the same reference designators in the drawings and description refers to the same, similar or analogous components and/or elements, while according to other implementations the same use should not. According to certain implementations, use of directional terms, such as, top, bottom, left, right, up, down, over, above, below, beneath, rear, and front, are to be construed literally, while in other implementations the same use should not. The present invention may be practiced in conjunction with various integrated circuit fabrication and other techniques that are conventionally used in the art, and only so much of the commonly practiced process steps are included herein as are necessary to provide an understanding of the present invention. The present invention has applicability in the field of semiconductor devices and processes in general. For illustrative purposes, however, the following description pertains to a method of manufacture of semiconductor gates.

Figure 1:
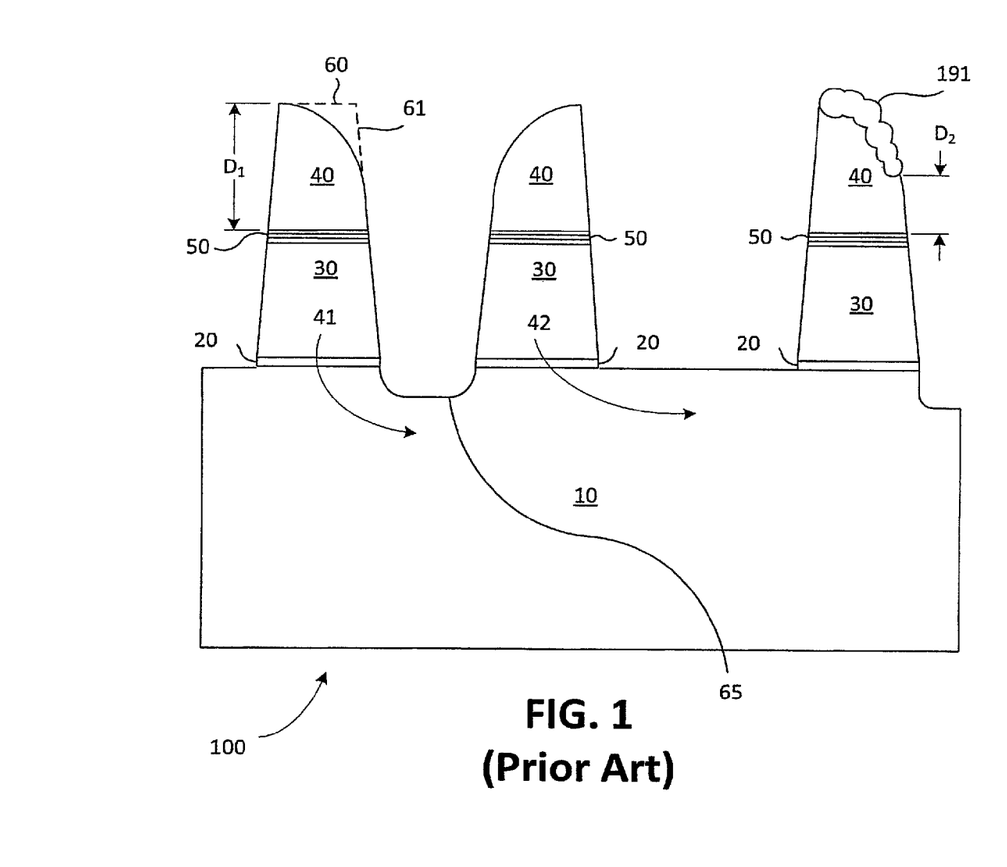
FIG. 1 is a cross-sectional diagram of a prior art semiconductor stack illustrating damage to a semiconductor, e.g., polysilicon (PL), gate.

Referring more particularly to the drawings, FIG. 1 illustrates a structure 100 formed in an intermediate step of a semiconductor fabrication process according to the prior art. The illustrated structure 100, which may be a portion of a large array formed by repeated patterns of which the structure 100 of FIG. 1 is representative, comprises a substrate 10, having a side on which are formed first features of a first silicon layer and second features of a second silicon layer, the first and second silicon layers being spaced apart by an insulator layer, such as a dielectric layer. The first and second silicon layers may comprise one or more of polysilicon or amorphous silicon. According to the described arrangement, the first and second features comprise, respectively, first semiconductor gates and second semiconductor gates, e.g., first polysilicon (PL) gates 30 and second PL gates 40.

The first PL gates 30 and second PL gates 40 are separated and insulated from each other by one or more insulating layers, such as charge trapping dielectric layers, e.g., in the form of oxide-nitride-oxide (ONO) layers 50 of a memory device. The device may form a portion of, for example, a memory chip wherein a source region 41 (not shown explicitly) in the substrate 10 may be formed in a region disposed nominally between a relatively closely-spaced pair of PL gates 30/40, the source area being penetrated by a trench 65 as a result of a self-aligned source (SAS) etch. A drain site 42 (not explicitly shown) may occupy a region in the substrate 10 nominally between a relatively more widely-spaced pair of PL gates 30/40.

As semiconductor cells are scaled, cobalt silicide (CoSi), which may support thinner line widths than other materials such as, for example, WSi or TiSi, may be formed as a cap on the second PL gates 40. Such a cap may best be formed on an upper surface of the PL gates 40 when the surface is flat as depicted by the dashed outline 60 in FIG. 1. When prior art methods are used, however, the etch step used to form the trench 65 may damage, e.g., partially remove material of, the second PL gates, resulting in a gate profile having a rounded corner 61.

Forming a silicide layer, e.g., a CoSi layer, on the upper surface of second PL gates 40 can be expected to result in a deformed, non-uniform CoSi profile 191 (shown on only one PL gate 40 for simplicity) caused by the rounded corner 61. Such a deformed profile could lead to a resistance issue, such as from a damaged profile having an unsmooth and/or zigzag topography.

Further, a separation between the ONO layer 50 and a CoSi layer 191 on an upper surface of PL gate 40 may be desired to be, e.g., a distance $D_1$, which may be a value ranging from about 500 Å to about 2000 Å as measured in a direction normal to the side of the substrate. However, due to the effect of the rounded corner 61, the actual distance may become, e.g., $D_2$, measured in the same direction, which, in some cases may be smaller than 500 Å and which may lead to electrical problems such as reliability, retention and disturb issues.

Figure 2A:
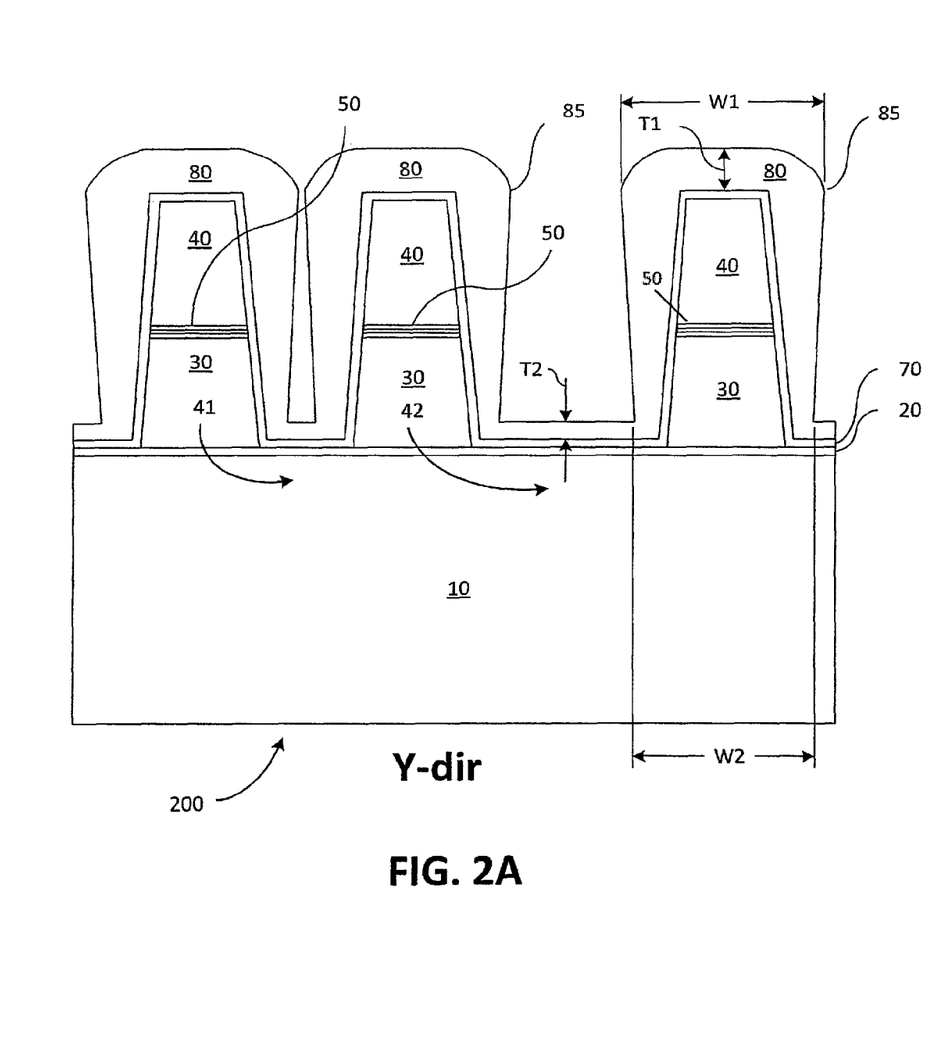
FIG. 2A is a cross-sectional diagram of a semiconductor stack illustrating an intermediate step in a process of fabricating a PL gate that includes layers of silicon nitride (SiN) and low temperature oxide (LTO) viewed along a Y-axis.

FIG. 2A is a cross-sectional diagram (viewed along a Y-axis) depicting a semiconductor structure 200 in an intermediate stage of a less damaging fabrication process according to the present invention. The illustrated structure 200 comprises a substrate 10 that may be formed of silicon. A gate oxide layer 20 having a thickness (TOX) of about 80 Å is disposed over the substrate 10. A pair of PL gates 30 and 40 are stacked on the oxide layer 20, the PL gates 30 and 40 being separated (i.e., insulated from each other) by an ONO layer 50 disposed between them. Formation of the gate oxide layer 20, PL gates 30, the ONO layer 50 and the PL gates 40 may be accomplished using methods known in the art. For example, oxide material such as tunnel OX may be deposited on the substrate 10 to form the gate oxide layer 20, and a first layer of conductive material such as metal or polysilicon may be deposited over the oxide layer 20. Layers of oxide, nitride, and oxide again may be deposited sequentially over the first layer to form an ONO layer, followed by a second conductive layer being formed on the ONO layer. The resulting stack of layers may be patterned and etched using photolithographic methods to form a pair of semiconductor gates, e.g., PL gates, 30 (from the first conductive layer) and 40 (from the second conductive layer), gates 30 and 40 being separated by a charge-trapping structure, e.g., ONO layers 50, as illustrated in FIG. 2A.

According to an aspect of the present invention, the structures formed by the PL gates 30 and 40 and the ONO layer 50 may be overlaid with a first liner formed by a thin layer of low temperature oxide (LTO) 70 such as $SiO_2$ using a known process, for example, of deposition at a temperature ranging from about 50° C. to about 500° C. A typical thickness of the LTO layer 70 may range from about 2 nm to about 50 nm.

Further, according to another aspect of the invention, the resulting structure may have overlaid thereon a second liner comprising a relatively thick silicon nitride (SiN) layer 80 having distinctive features. In particular, the SiN layer 80 may exhibit an overhang profile 85 whereby an exposed portion of the SiN layer 80 has a width W1 at an upper portion thereof, i.e., near upper surfaces of the second PL gates 40, that is greater than a width W2 at lower portions of the first PL gates 30. Further, a thickness T1 of the upper portion of the SiN layer 80 may be greater than a thickness T2 of a lower portion of the SiN layer 80 disposed directly above the gate oxide layer 20.

In representative embodiments, the width W1 may range from about 50 nm to about 200 nm, preferably about 100 nm, with the width W2 ranging from about 25 nm to about 50 nm with a preferred value of about 40 nm. The thickness T1 may take values between about 100 Å and about 1000 Å; the thickness T2 may range from about 50 Å to about 500 Å. Respective preferred values for T1 and T2 are about 500 Å and 80 Å. A typical thickness of the SiN layer 80, measured at the lower portion and in a direction parallel to the side of the substrate 10, may range from about 50 Å to about 500 Å (or to about 750 Å in other embodiments).

One method of forming the thick SiN layer 80 employs a plasma-enhanced chemical vapor deposition (PECVD) process. Using $SiH_4+N_2O$ in a PECVD tool and then adjusting high $SiH_4$ and high bias power can produce an overhang profile 85 in the SiN layer 80 as illustrated in FIG. 2A.

Figure 2B:
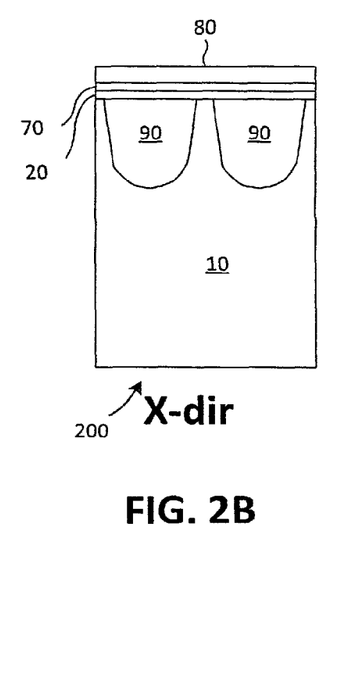
FIG. 2B is a diagram illustrating a view of the structure of FIG. 2A taken in a direction of an X-axis.

FIG. 2B illustrates a cross-section of the structure 200 of FIG. 2A as viewed along an X-axis. The figure, which illustrates the substrate 10, the gate oxide layer 20 and the SiN layer 80, also illustrates a cross-section of shallow trench isolation (STI) structures 90 that may form a portion of the semiconductor structure 200.

Figure 3A:
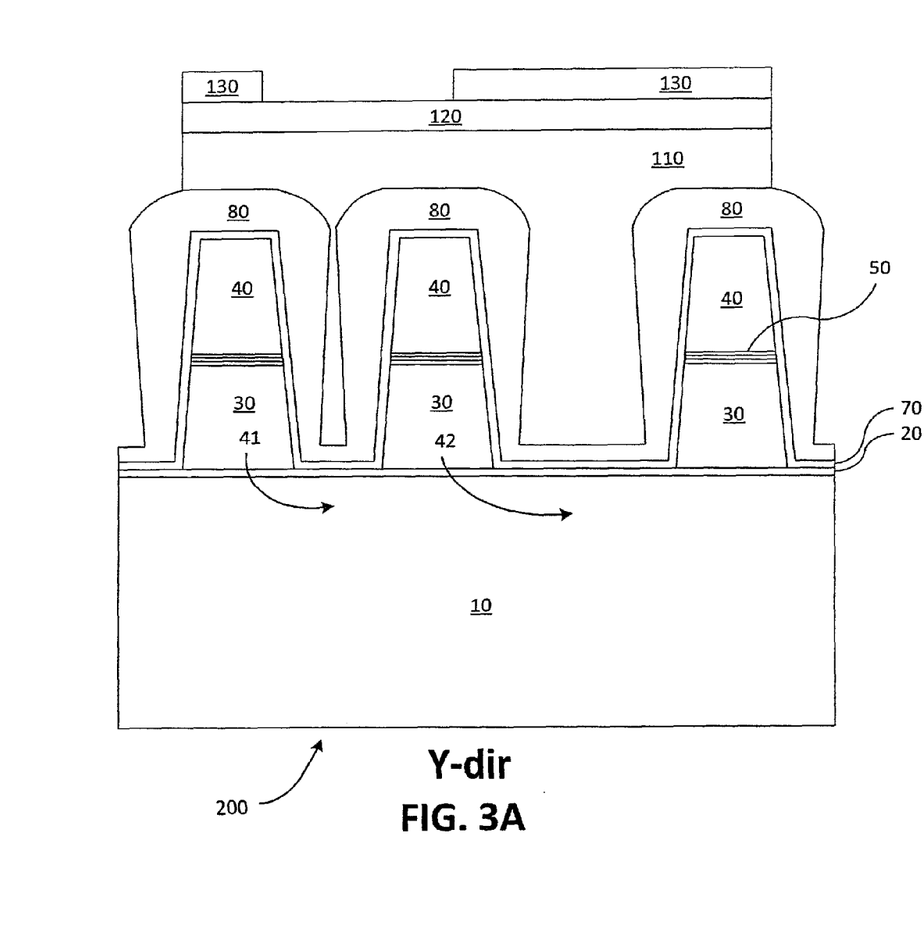
FIG. 3A is a cross-sectional diagram showing an effect of depositing an organic dielectric layer (ODL), a silicon-containing hard mask bottom anti-reflecting coating (SHB) layer, and a layer of patterned photoresist (PR) onto the semiconductor stack of FIG. 2A as viewed along a Y-axis.
Figure 3B:
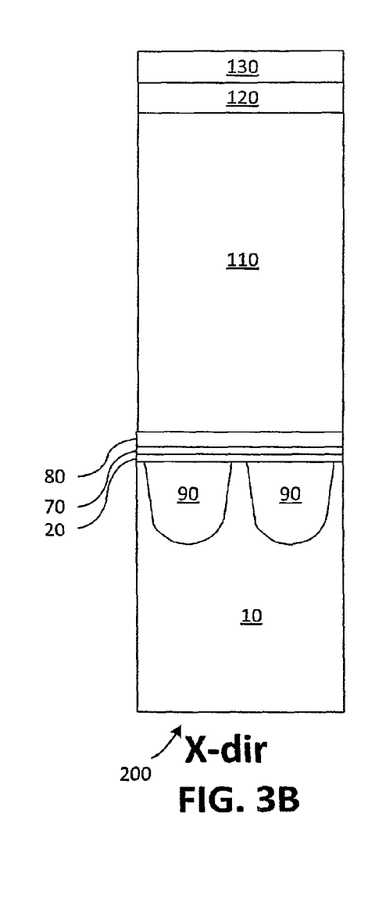
FIG. 3B is an X-axis view of the formation of FIG. 3A.

Continuing, with reference to FIG. 3A, which is built upon the structure 200 of FIG. 2A, an organic dielectric layer (ODL) 110 formed of carbon-like materials by, e.g., a spin coating process, may be overlaid on the SiN layer 80, the ODL layer 110 having a nominally planar surface and covering top portions of SiN layer 80 to a depth of about 500 Å. The ODL layer 110 may have disposed thereon a silicon-containing hard mask bottom anti-reflection coating (SHB) layer 120 formed by a spin coating process and having a thickness of about 300 Å on which is formed a layer of patterned photoresist (PR) material 130. The PR, SHB, and ODL layers 130, 120 and 110 may act to protect lower layers (e.g., a drain site 42 disposed in the substrate and not explicitly shown) of the illustrated structure during a subsequent etch step. The layers, further, can provide high resistance to etching and be easily removed. A further purpose of these three layers is using PR to open SHB (selectivity is about 1) and then using SHB to open ODL (SHB has high selectivity to ODL). An X-axis view of the structure 200 is illustrated in FIG. 3B.

Figure 4:
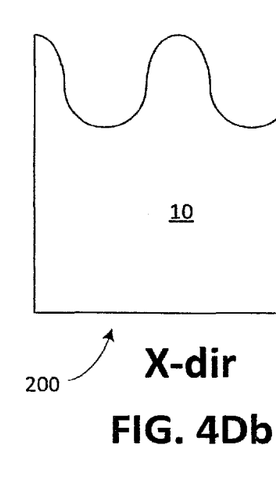
Figure 4A:
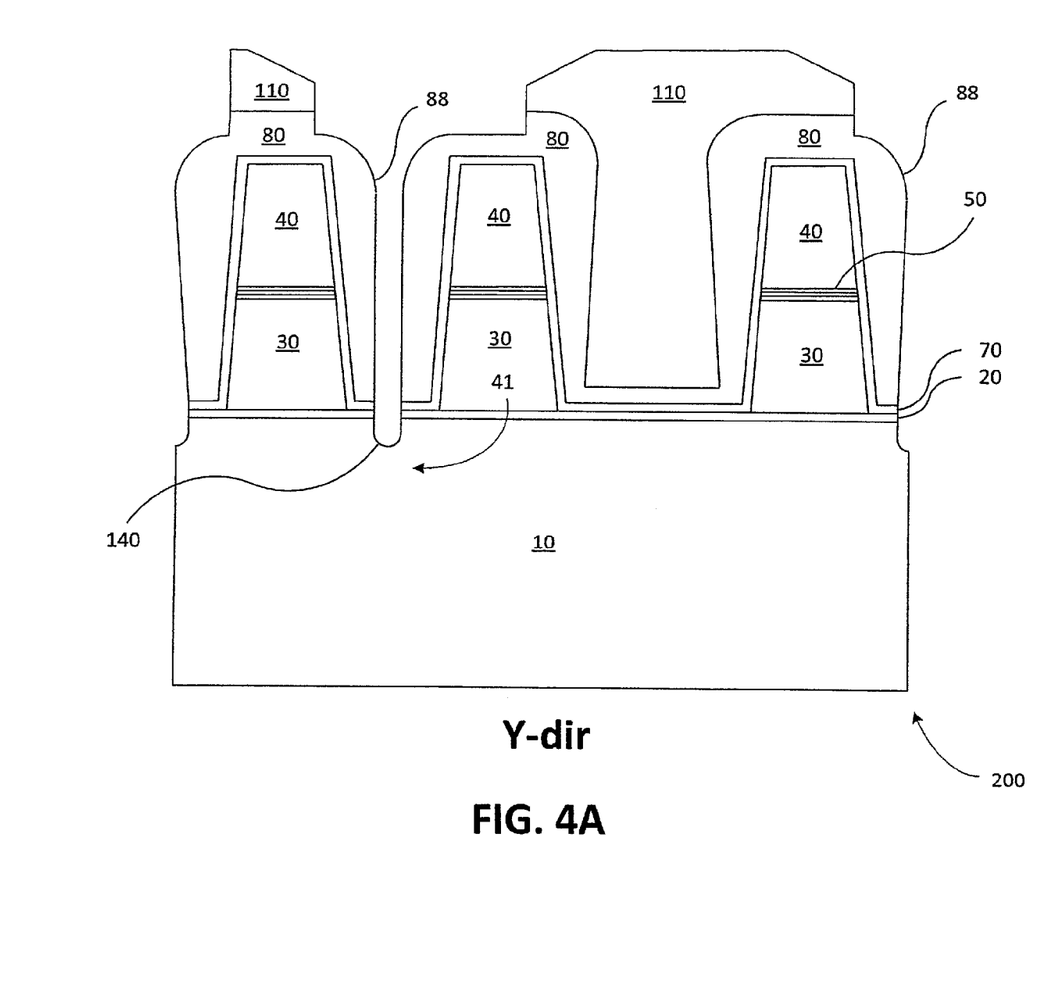
FIG. 4A illustrates a result of performing a self-aligned source (SAS) etch procedure on the structure of FIG. 3A.

FIG. 4A illustrates a result of a self-align (SiN layer) SAS etch having been implemented to remove the SHB layer 120 and portions of the ODL 110 from the structure of FIG. 3A according to the pattern of the PR layer 130. The SAS etch may employ anisotropic etching gases such as $C_4F_6$, $C_4F_8$, $C_5F_8$, for example, having a high oxide selectivity with respect to SiN. In representative embodiments, a selectivity ratio of oxide to SiN may range from about 3 to about 15, a preferred value being about 10. The high selectivity ratio of oxide to SiN not only can break through the oxide layer 20 but also can effectively protect the SiN layer 80 thereby avoiding PL Gate damage. As used herein, a statement that an etch has a high selectivity to material A with respect to material B means that the etch has a much stronger effect on A than on B with a result that much more of A than B is removed when the etch acts on both materials.

The SAS etch may remove a portion, but not all, of the SiN layer 80. For instance, the SAS etch may substantially eliminate or reduce the overhang profile 85 (FIG. 2A) of the SiN layer 80, e.g., to a shape 88. The overhang profile 85 of the SiN layer 80 may help to achieve optimal formation/operation of a trench 140 (cf. below) by, e.g., effectively compensating for some inevitable partial removal of the SiN layer 80 during the SAS etch, thereby protecting the PL gates 40 from damage of a type shown in FIG. 1. In typical embodiments, following the SAS etch, a thickness of the SiN layer 88, measured at the lower portion and in a direction parallel to the side of the substrate 10, may remain unchanged, or alternatively, may remain about the same or only slightly changed. To the extent moderately changed, the thickness may be attenuated so as to range, following the SAS etch, by way of example only and not limitation, from about 25 Å to about 475 Å. According to modified implementations, such as one in which the drawing is interpreted to be to scale or about to scale, the thickness of the SiN layer 88 can be about two to five times that of the LTO layer 70, each of the thicknesses being measured at the lower portion and in a direction parallel to the side of the substrate 10.

When the SAS etch also forms the trench 140 in the silicon substrate 10, in line with an aspect of the invention, it is desirable that the trench 140 resulting therefrom have nominally straight and vertical sides (cf. the T-shape profile illustrated in detail in FIG. 4Eb). Further, the trench 140 formed in the source region 41 of the substrate may be relatively narrow relative to the trench 65 (FIG. 1) that is formed when prior art methods are used. Using the natural interpretation of the structures formed by PL gates 30/40 and ONO layer 50 constituting first and second memory cells, the trench will be disposed a first distance from the first memory cell and a second distance from the second memory cell, extend a depth into the substrate, and/or be characterized by a width less than or about equal to either of (i) the first distance and/or (ii) the second distance; according to one implementation the trench has a width about equal to (iii) a sum of the first distance and the second distance. One or more of (i), (ii) and (iii) may correspond to any one or more of the illustrations of FIGS. 4A-4Ea, in which, for instance, by way of example and not limitation, certain instances/implementations of the embodiments can be interpreted to be to scale.

Hence, in certain implementations, either the first distance and/or the second distance may correspond to the sum of the thickness of the SiN layer 88 and the LTO layer 70, each being measured at the lower portion and in a direction parallel to the side of the substrate 10.

According to some implementations, such as one in which the drawing is interpreted to be to scale, the trench 140 is about as wide as, or in other implementations, narrower than, the thickness of the SiN layer 88 at the lower portion as measured in a direction parallel to the side of the substrate 10. According to other implementations, such as ones in which the drawing is interpreted to be to scale yet again, the trench 140 is about as wide as, or in other implementations, narrower than, a sum of the thickness of the LTO layer 70 and the SiN layer 88 at the lower portion as measured in a direction parallel to the side of the substrate 10. Additionally, or alternatively, the trench 140 can be about as wide as, or in other implementations, narrower than, its depth.

The T-shape profile illustrated in FIG. 4Ea evidently corresponds to relatively less damage to the substrate 10 than results from application of prior art methods. SiN material not removed by/during the SAS etch process may form a hard mask that causes the SAS etch to form the desired relatively narrow trench 140. It may also be noted that, although the SAS etch step may remove a portion of the SiN layer 80, an upper part of the SiN layer 80 is not removed while the lower part, the part directly disposed above the oxide layer 20, is removed. This selective removal is a consequence of forming the SiN layer 80 with T1>T2.

The PR layer 130, which may function as a hard mask for the SAS etch step, may subsequently be removed by a process involving, e.g., an ODL etch.

Figure 4B:
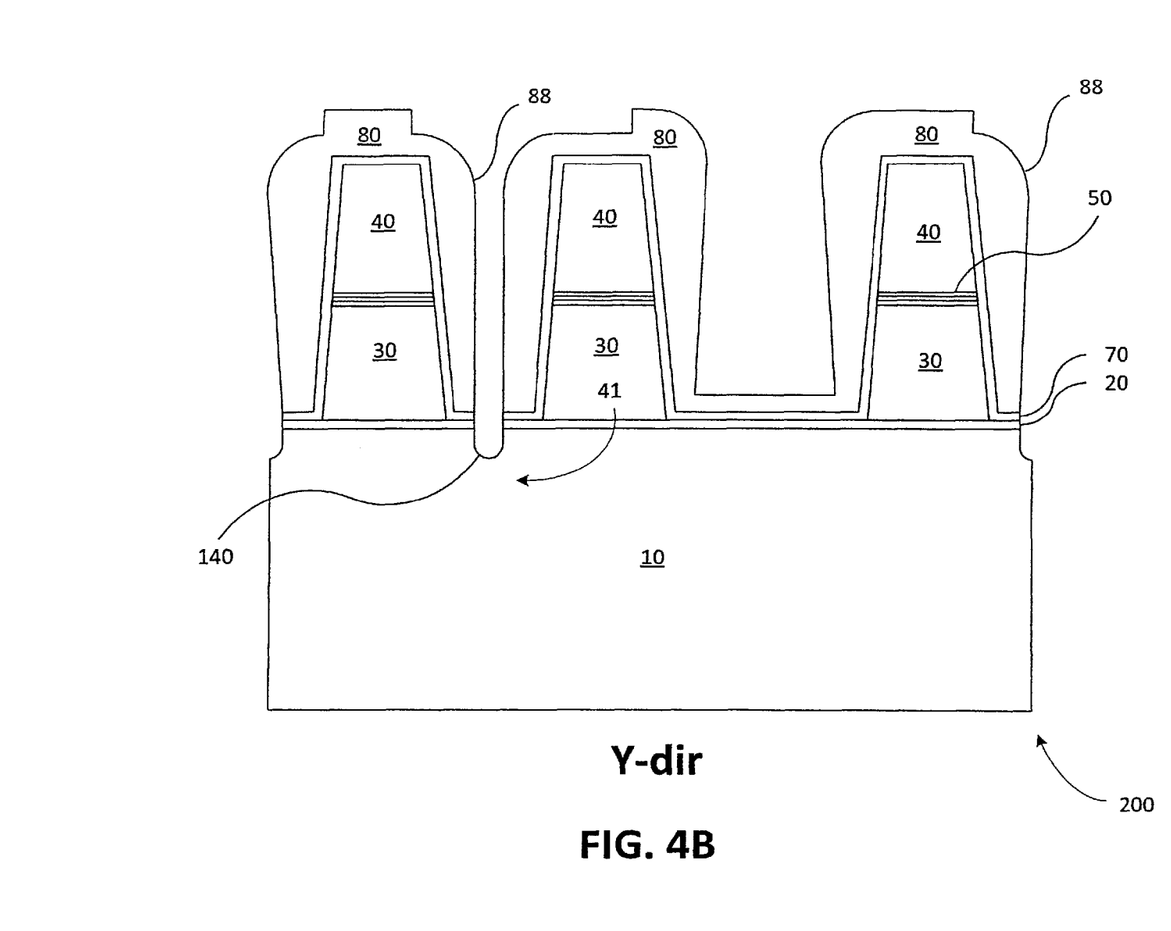
FIG. 4B depicts an effect of removing remaining ODL material from the device of FIG. 4A.
Figure 4C:
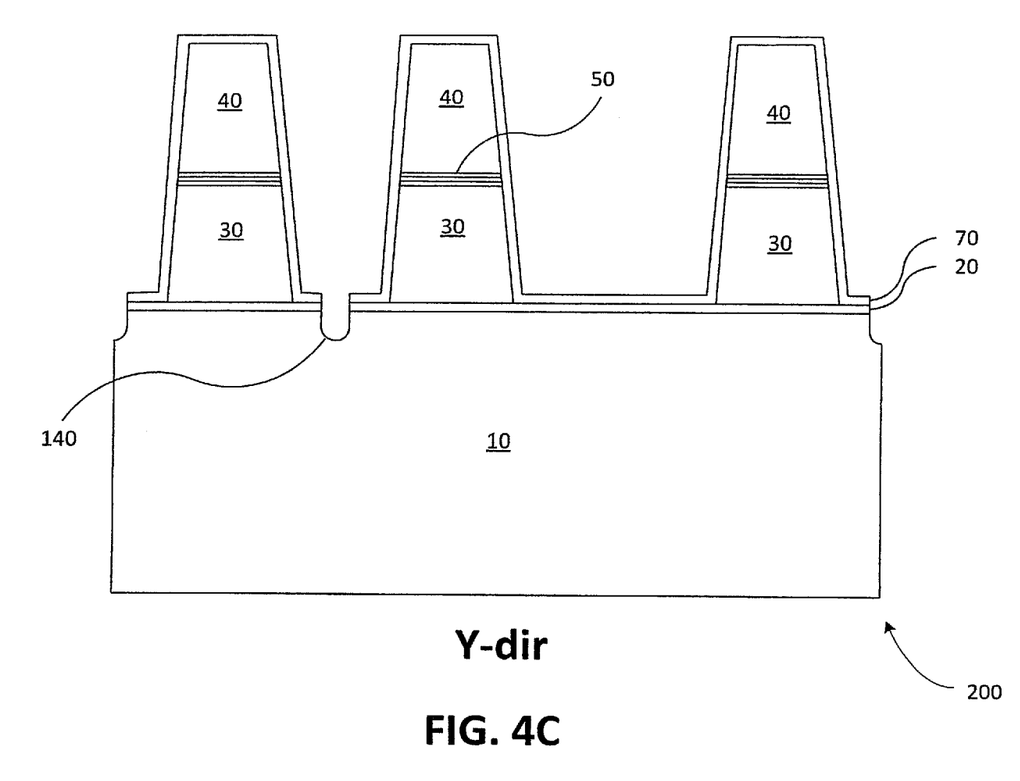
FIG. 4C shows the structure of FIG. 4B with the SiN layer removed.

The ODL 110 may then be stripped from the structure using a dry strip process, causing the structure of FIG. 4A to appear as shown in FIG. 4B. The SiN layer 80 then may be removed by, e.g., a dry etch or a wet etch (using, e.g., hot phosphoric acid) having a high SiN to oxide selectivity and a high selectivity of SiN to PL leaving, as illustrated in FIG. 4C, PL gates 30 and 40 intact under an overlying LTO layer 70. The LTO layer 70 may act as a stop layer for this SiN etch, thereby protecting the ONO layer 50 from damage during the SiN etch. The SiN etch may employ a selective etch gas such as, for example, $CH_3F$, $CHF_3$ and $CH_2F_2$. Hot phosphoric acid ($H_3PO_4$) can be used in micro-fabrication to etch the SiN, and such can provide high selectivity to oxide. And using $C_4F_8$, $C_4F_6$, $C_5F_8$ (more carbon) etching gas can obtain high oxide-to-PL selectivity. Illustrative values for SiN-to-oxide ratios are between about 1 and about 25 with a ratio of about 5 being preferred.

The LTO layer 70 may subsequently be removed using an etch having high oxide-to-PL selectivity (e.g., a dry etch or SiConi™ etch) to expose the PL gates 30/40 as illustrated in FIG. 4Da. Anisotropic etching gases such as, for example, $CF_4$, $CHF_3$, $CH_3F$, $CH_2F_2$, $C_4F_6$, $C_4F_8$ and $C_5F_8$, and isotropic etching gases that may include, e.g., $NH_3$ and $HF_3$, may exhibit a high degree of selectivity of oxide to PL. According to a preferred embodiment, isotropic etching gases are used for commensurate isotropic etching that can avoid ion-bombardment damage to the PL Gates. By-product exhaust gas corresponding to these etching gases may contain, for example, $H_2$, $CH_4$, $H_2O$ and $NH_3$ when gas temperatures exceed 100° C. In these higher temperature conditions (>100° C.), C, O, N residues on line pattern surfaces will be evaporated easily in the higher temperature condition. As illustrated in FIG. 4Da, and with reference to the descriptions of FIGS. 2A and 4A, the SiN layer 80 may protect the LTO layer 70 and, consequently and more importantly, the PL gates 40 from effects of the SAS etch that forms the trench 140. The PL gate structure 40 therefore may be substantially unaffected by the SAS etch step. Subsequent process steps (i.e., removal of the SiN layer 80 and the LTO layer 70) may expose the PL gates 30/40 in an undamaged form. That is, an upper surface 160 of PL gate 40 may be nominally flat in contrast with the profile of PL gate 40 that results when prior art methods are used (cf. rounded corner 61 in FIG. 1). As a consequence of the invention, the undamaged PL gate 40 is thus better able to have formed thereon a silicide, e.g., a layer of CoSi. FIG. 4Db illustrates a view of the structure 200 along an X-axis.

Formation of a silicide, e.g., a CoSi layer 190, on the PL gates 40, illustrated in FIG. 4Ea, may be accomplished by a rapid thermal annealing (RTA) process. Here, as a consequence of damage to corners (cf. 60, FIG. 1) of the PL gates 40 being attenuated or eliminated, corners are not disadvantageously deformed, e.g., rounded, as was the case with corners 61 of FIG. 1. The silicide, e.g., CoSi layer 190 exhibits a relatively uniform shape and optimized function, with all regions of the silicide layer in the depicted embodiment being spaced sufficiently from the ONO layer 50. Hence, the silicide formation is not too closely disposed to the insulating layer, e.g., the ONO layer 50, whereby resistance, reliability, retention and/or disturb issues advantageously can be reduced or avoided. By way of comparison with reference to FIG. 1, according to a feature of the invention, all of the CoSi layer is formed at a distance corresponding to D1 rather than D2.

As further consequence of the invention, a recess profile in the silicon substrate 10 in the source region 41 between PL gates 30 may have a T-shape as depicted in FIG. 4Eb. This T-shape, obtained by employing an etch having high oxide, nitride to PL selectivity and by using two types of liner (SiN and LTO), may be contrasted with the relatively wide profile of the trench 65 (FIG. 1) obtained using prior art methods. This T-shape can be advantageous, owing, for example, to less silicon substrate damage being produced.

Figure 5:
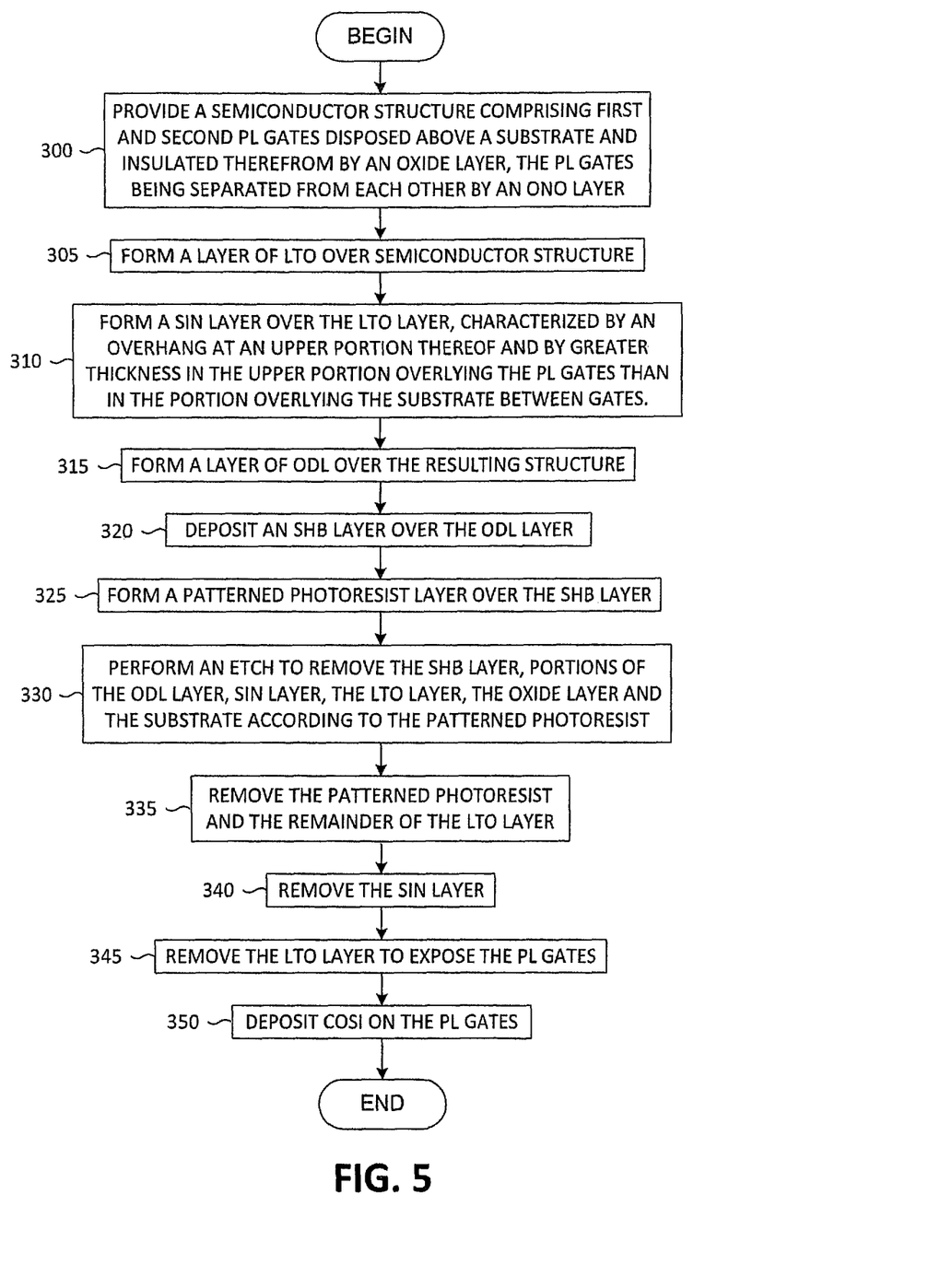
FIG. 5 is a flow diagram summarizing an implementation of a method of fabricating PL gates according to the present invention.
Figure 6:
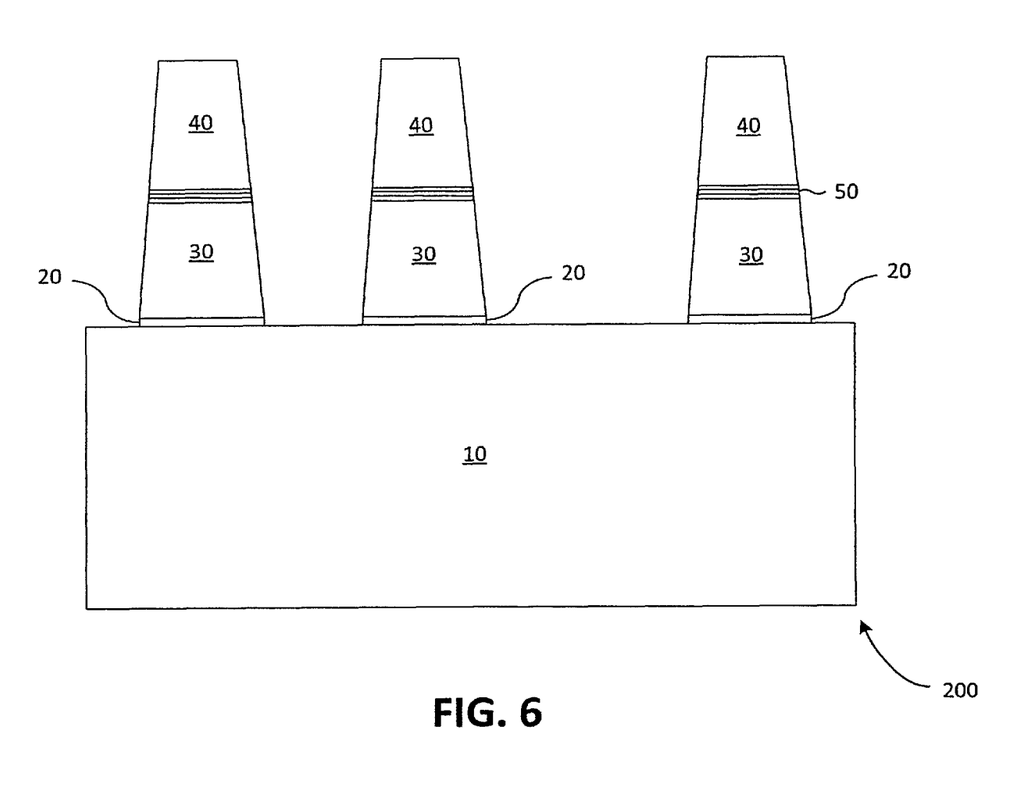
FIG. 6 is a cross-sectional diagram of a semiconductor stack comprising PL gates.

An aspect of the present invention is a method of forming PL gates having a profile suitable for deposition of CoSi thereon. FIG. 5 is a flow diagram summarizing one implementation of the method. The implementation commences at step 300 by providing, with reference to FIG. 6, a semiconductor structure 200 corresponding to an earlier processing stage of FIG. 1, or any of the other figures (or other applications/contexts altogether), and comprising a substrate 10, which may be formed of silicon, a stack of first PL gates 30 and second PL gates 40, with second PL gates 40 separated by ONO layers 50 from the first PL gates 30. The first PL gates 30 may be insulated from the substrate by an oxide layer 20. First and second liner layers may be sequentially deposited on the structure of FIG. 6 as follows (cf. FIGS. 2A and 2B). The first liner, e.g., a layer of LTO, may be formed, e.g., deposited, over the semiconductor structure 200 at step 305. At step 310 the second liner, e.g., a SiN layer 80 may be formed over the LTO layer 70. The SiN layer 80 may be disposed with a first thickness T1 above the PL gates 40 and with a second thickness T2<T1 above the substrate and between PL gates 30. The SiN layer 80, further, may be formed to be wider at an upper part than at a lower part thereof. That is, with reference to FIG. 2A, a portion of the SiN layer 80 near the top of PL gates 40 may have a first width W1 and a second width W2 near the bottom of PL gates 30 with W2<W1. The effect is to create an overhang profile 85 in the upper portion of the SiN layer 80. As described above in discussion relative to FIG. 2A, the overhang profile 85 may be obtained by using $SiH_4+N_2O$ in a PECVD tool and then adjusting high $SiH_4$ and high bias power to obtain the desired result.

Preparatory to performing an etch step to form a SAS, and with reference to FIGS. 3A and 3B, an ODL layer 110 may be disposed over the SiN layer 80 at step 315, and a SHB layer 120 may be formed on the ODL layer 110 at step 320. At step 325, a patterned PR layer 130 may be formed on the SHB layer 120, the PR layer 130 being disposed to permit exposing a portion of the PL gates 30/40. Then, according to the patterned PR 130, a SAS etch may be performed at step 330 to remove the SHB layer 120 and portions of the ODL layer 110, portions of the SiN layer 80 and the oxide layer 20. A portion of the substrate 10 also may be removed by the SAS etch to form a trench 140, thereby creating the SAS. FIG. 4A illustrates a result of performing the etch at step 330. The SAS etch step may be performed using anisotropic etch gases such as $C_4F_6$, $C_4F_8$, $C_5F_8$, which exhibit high oxide-to-SiN selectivity, to remove material between pairs of PL gates 30/40 not protected by the PR layer 130, which may function as a hard mask. Referring to FIGS. 2A and 4A, the etch may operate to remove the relatively thin (i.e., thickness=T2) portion of the SiN layer 80, portions of the relatively thick (i.e., thickness=T1) SiN layer 80 disposed above the PL gates 40, and portions of the overhang profile 85. Because the thickness of the SiN layer 80 is greater at the top than the bottom (i.e., T1>T2), SiN material remains after the SAS etch so that the PL gates 40 are protected from damage. Additionally, the SAS etch removes portions of the LTO layer 70, the oxide layer 20, and the oxide disposed in STI structures 90, which oxide needs to be etched cleanly as illustrated, e.g., in FIG. 4Db, thereby forming the trench 140 illustrated in FIG. 4A. As a consequence of the action of the SAS etch step, sides of the trench 140 (i.e., the SAS) may be nominally straight, narrow and vertical.

The patterned PR layer 130 and the portion of the LTO layer 110 not already removed may be removed at step 335. FIG. 4B illustrates the effect of the removal, the PL gates 30/40 being covered by only the LTO layer 70 and the SiN layer 80. The SiN layer 80 and the LTO layer 70 may be removed at, respectively, steps 340 and 345 of the implementation of FIG. 5 (cf. FIG. 4C with SiN 80 removed and FIG. 4Da with the LTO 70 removed). Etch gases such as $CH_3F$, $CHF_3$, $CH_2F_2$ having a selectivity of SiN to oxide and etch gases such as $CF_4$, $CHF_3$, $CH_3F$, $CH_2F_2$, $C_4F_6$, $C_4F_8$, $C_5F_8$ having a selectivity of oxide to PL may be employed at this step.

It is a feature of the invention that a method, an implementation of which is summarized in FIG. 5, may create PL gates 40 having undamaged profiles as shown in FIG. 4Da. By undamaged is meant that an upper surface 160 of the PL gates 40 is nominally flat and suitable for formation of CoSi. Accordingly, at step 350 of the implementation, CoSi 190 may be deposited on an upper surface of PL gates 40 as shown in FIG. 4Ea.

An embodiment of the present invention comprises a semiconductor structure formed according to the method described herein and further comprises a layer of CoSi formed on an upper surface of semiconductor gates, e.g., PL gates 40 (FIG. 4Ea). A length of a separation between the CoSi layer 190 and the ONO layer 50 may be approximately equal to a distance $D_3$ over all the PL gates 40 in the semiconductor structure. Further, the length of a separation measured on a left side of a PL gate 40 may be about equal to a corresponding distance measured on a right side of the same gate.

In accordance with a feature of the invention, a semiconductor structure can be provided, having a substrate, a first memory cell and a second memory cell formed above a side of the substrate, and further having a T-shape trench in the substrate between the first memory cell and the second memory cell. The trench can be disposed a first distance from the first memory cell and a second distance from the second memory cell, extend a depth into the substrate, and/or be characterized by one or more of (i) a width less than or about equal to the first distance, (ii) a width less than or about equal to the second distance, and (iii) a width less than or about equal to a sum of the first distance and the second distance. Here, the T-shape can be conceptualized as comprising a center with opposing arms and a stem extending outwardly therefrom, the arms being oriented to extend away from the center in directions parallel to the side and corresponding geometrically to the first distance and the second distance, and the stem being oriented to extend in a direction transverse to the side into the substrate and corresponding geometrically to the trench, whereby a T-shape results from the relative shapes and orientations of the first distance, the second distance and the trench. In contrast to the geometry depicted in FIG. 1, sidewalls of the trench can be vertical (or, alternatively, about vertical) to the side of the substrate and/or have more than a quarter, and, typically, more than half (or, alternatively, more than three quarters), of their lengths extending normal (or, alternatively, substantially normal) to the side. Furthermore, either or each of the first distance and the second distance can be defined by the sum of the thicknesses of the first and second liners.

Although the disclosure herein refers to certain illustrated embodiments, it is to be understood that these embodiments have been presented by way of example rather than limitation. The intent accompanying this disclosure is to have such embodiments construed in conjunction with the knowledge of one skilled in the art to cover all modifications, variations, combinations, permutations, omissions, substitutions, alternatives, and equivalents of the embodiments, to the extent not mutually exclusive, as may fall within the spirit and scope of the invention as limited only by the appended claims.

What is claimed is:

1. A semiconductor structure, comprising:
    a substrate;
    a first memory cell and a second memory cell formed above a side of the substrate; and
    a T-shape trench in the substrate between the first memory cell and the second memory cell;
    wherein the trench is disposed a first distance from the first memory cell and a second distance from the second memory cell, extends a depth into the substrate, and is characterized by one or more of (i) a width less than or about equal to the first distance, (ii) a width less than or about equal to the second distance, and (iii) a width less than or about equal to a sum of the first distance and the second distance,
    wherein the T-shape comprises a center with opposing arms and a stem extending outwardly therefrom, the arms extending away from the center in directions parallel to the side and corresponding geometrically to the first distance and the second distance, and the stem extending in a direction transverse to the side into the substrate and corresponding geometrically to the trench, whereby a T-shape results from the relative shapes and orientations of the first distance, the second distance and the trench.

2. The semiconductor structure as set forth in claim 1, wherein sidewalls of the trench are substantially vertical and oriented so as to extend in directions substantially transverse to the side.

3. The semiconductor structure as set forth in claim 1, wherein the trench is formed using a first liner layer having a first thickness and a second liner layer having a second thickness, and one or more of the first distance and the second distance is defined by a sum of the first and second thicknesses.

4. A semiconductor structure comprising:
    a substrate;
    a plurality of first features of a first silicon layer disposed above a side of the substrate and insulated therefrom by an insulator layer;
    a plurality of second features of a second silicon layer disposed above the first features, the second features being insulated from the first features;
    a first liner layer disposed over the semiconductor structure; and
    a second liner layer disposed over the first liner layer, whereby the second liner layer is constructed with a first width at an upper portion of the second features and with a second width at a lower portion of the first features, the first and second widths being measured in a direction parallel to the side and the second width being less than the first width.

5. The semiconductor structure as set forth in claim 4, wherein the first and second features comprise first and second polysilicon (PL) gates, and the second liner layer is disposed with a first thickness at an upper portion of the second PL gates and with a second thickness at a lower portion between spaced apart first PL gates, the second thickness being measured in a direction normal to the side and being less than the first thickness.

6. The semiconductor structure as set forth in claim 4, wherein the first and second features comprise first and second polysilicon (PL) gates, and an overhang is created near an upper portion of the second PL gates in disposing the second liner layer.

7. The semiconductor structure as set forth in claim 4, wherein the first liner layer is composed of low-temperature oxide (LTO);
    the second liner layer is composed of silicon nitride;
    an organic dielectric layer (ODL) is disposed over the second liner layer;

a silicon-containing hard mask bottom anti-reflecting (SHB) layer is disposed over the ODL; and a patterned photoresist layer is disposed over the SHB layer, the patterned photoresist layer being disposed to expose a portion of the ODL and underlying layers.

8. The semiconductor structure as set forth in claim 7, wherein portions of the ODL layer, the silicon nitride layer, the LTO layer and the substrate are removed according to the patterned photoresist layer and oxide disposed in shallow-trench isolation structures between PL gates is removed.

9. The semiconductor structure as set forth in claim 8, wherein:

the second liner layer is removed;

the first liner layer is removed; and a cobalt silicide layer is formed on an upper surface of the second features.

10. A semiconductor structure of claim 9, wherein a length of separation between all parts of the cobalt silicide layer and the insulator layer is approximately equal over the plurality of second features.

11. The semiconductor structure as set forth in claim 8, wherein the first and second features comprise first and second polysilicon (PL) gates, and a cobalt silicide layer is formed on an upper surface of the second PL gates.

12. The semiconductor structure as set forth in claim 11, wherein a T-shaped profile is present in the substrate between spaced-apart first PL gates.

13. The semiconductor structure as set forth in claim 4, wherein:

the first and second silicon layers comprise one or more of polysilicon or amorphous silicon; and the first and second silicon layers are insulated by a charge-trapping dielectric layer.

14. The semiconductor structure as set forth in claim 13, wherein:

the charge-trapping dielectric layer comprises an oxide-nitride-oxide (ONO) layer;

the first liner comprises a relatively-thin low temperature oxide (LTO); and the second liner layer comprises a relatively-thick silicon nitride (SiN) layer.

15. The semiconductor structure as set forth in claim 4, wherein the first and second features comprise first and second polysilicon (PL) gates.

16. A semiconductor structure comprising:

a plurality of first features of a first silicon layer disposed above a side of a substrate and insulated therefrom by an insulator layer; and a plurality of second features of a second silicon layer disposed above the first features, the second features being insulated from the first features; and a first liner layer disposed over the semiconductor structure, and a second liner layer disposed over the first liner layer, whereby the second liner layer is constructed with a first thickness on tops of the second features and with a second thickness at bottoms of and between the first features, the first and second thicknesses being measured in a direction normal to the side and the second thickness being less than the first thickness.

17. The semiconductor structure as set forth in claim 16, wherein:

the first and second silicon layers comprise one or more of polysilicon or amorphous silicon; and the first and second silicon layers are insulated by a charge-trapping dielectric layer.

18. The semiconductor structure as set forth in claim 17, wherein the charge-trapping dielectric layer comprises:

an oxide-nitride-oxide (ONO) layer;

the first liner layer comprises a relatively-thin low temperature oxide (LTO);

the second liner layer comprises a relatively thick silicon nitride (SiN) layer; and the first and second features comprise first and second semiconductor gates.

* * * * *